United States Patent
Togo

(10) Patent No.: US 9,202,695 B2
(45) Date of Patent: Dec. 1, 2015

(54) METHOD FOR PROVIDING A GATE METAL LAYER OF A TRANSISTOR DEVICE AND ASSOCIATED TRANSISTOR

(71) Applicant: IMEC, Leuven (BE)

(72) Inventor: Mitsuhiro Togo, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 14/271,956

(22) Filed: May 7, 2014

(65) Prior Publication Data

US 2014/0332864 A1 Nov. 13, 2014

(30) Foreign Application Priority Data

May 7, 2013 (EP) .................................... 13166902

(51) Int. Cl.
| | |
|---|---|
| *H01L 21/28* | (2006.01) |
| *H01L 29/49* | (2006.01) |
| *H01L 29/66* | (2006.01) |
| *H01L 29/78* | (2006.01) |

(52) U.S. Cl.
CPC .... *H01L 21/28008* (2013.01); *H01L 21/28097* (2013.01); *H01L 29/4975* (2013.01); *H01L 29/66545* (2013.01); *H01L 29/78* (2013.01)

(58) Field of Classification Search
CPC .................. H01L 21/28008; H01L 21/28097; H01L 29/4975; H01L 29/66545; H01L 29/78; H01L 21/28079; H01L 21/28088; H01L 21/3215; H01L 29/4966; H01L 29/495
USPC .................. 438/592, 595; 257/392, E21.631, 257/E21.632
See application file for complete search history.

(56) References Cited

U.S. PATENT DOCUMENTS

| | | | |
|---|---|---|---|
| 7,071,086 B2 * | 7/2006 | Woo ................. | H01L 21/28079 257/E21.202 |
| 7,091,118 B1 | 8/2006 | Pan et al. | |
| 8,294,202 B2 * | 10/2012 | Jangjian ............. | H01L 29/4966 257/327 |
| 2004/0126977 A1 | 7/2004 | Bustos et al. | |
| 2011/0062526 A1 * | 3/2011 | Xu et al. ..................... | 257/369 |
| 2012/0129312 A1 | 5/2012 | Utomo et al. | |

(Continued)

OTHER PUBLICATIONS

European Search Report, European Patent Application No. 13166902.0, dated Jun. 21, 2013.

(Continued)

*Primary Examiner* — Marc Armand
*Assistant Examiner* — Christina Sylvia
(74) *Attorney, Agent, or Firm* — McDonnell Boehnen Hulbert & Berghoff LLP

(57) ABSTRACT

A method includes providing a dummy gate structure on a substrate. The dummy gate structure includes a gate dielectric layer and a dummy gate electrode layer, and is laterally defined by inner sidewalls of a set of spacers. The method also includes laterally embedding the dummy gate structure, removing the dummy gate electrode, and providing a final gate electrode layer in between the inner sidewalls of the set of spacers. Providing the final gate electrode layer further includes providing a diffusion layer that extends on top of the gate dielectric layer, on inner sidewalls of the spacers, and on a portion of a front surface of embedding layers for the dummy gate structure. Providing the final gate electrode also includes providing a metal on top of the diffusion layer, applying an anneal step, and filling the area in between the inner sidewalls of the set of spacers with a final gate metal filling layer. The present disclosure also relates to an associated transistor.

13 Claims, 6 Drawing Sheets

(56) References Cited

U.S. PATENT DOCUMENTS

2012/0132998 A1 5/2012 Kwon et al.
2012/0135590 A1 5/2012 Hendrix et al.

OTHER PUBLICATIONS

Anil, K.G. et al., "CMP-Less Integration of Fully Ni-Silicided Metal Gates in FinFETs by Simultaneous Silicidation of the Source, Drain, and the Gate Using a Novel Dual Hard Mask Approach", VLSI Technology, 2005, Digest of Technical Papers, 2005 Symposium, Kyoto, Japan, Jun. 14-16, 2005, pp. 198-199.

Matsuki, Takeo et al., "Area-Selective Post-Deposition Annealing Process Using Flash Lamp and Si Photoenergy Absorber for Metal/High-k Gate Metal-Insulator-Semiconductor Field-Effect Transistors With NiSi Source/Drain", Japanese Journal of Applied Physics, vol. 45, No. 4B, Apr. 1, 2006, pp. 2939-2944.

Kesapragada, Sree et al., "High-k/Metal Gate Stacks in Gate First and Replacement Gate Schemes", 2010 IEEE/SEMI Advanced Semiconductor Manufacturing Conference (ASMC), Aug. 2010, pp. 256-259.

"Replacement Gate Process", The Materials Metrology Company, ReVera—HGMK Replacement Gate Process Flow, http://sonic.net/~revera/revera.com/VeraFlex/hkmg_approachesReplacement.htm, May 5, 2014, 1 page.

* cited by examiner

METHOD FOR PROVIDING A GATE METAL LAYER OF A TRANSISTOR DEVICE AND ASSOCIATED TRANSISTOR

CROSS-REFERENCE TO RELATED APPLICATION

This application claims priority to European Patent Application No. 13166902.0 filed on May 7, 2013, the contents of which are hereby incorporated by reference

TECHNICAL FIELD

The present disclosure relates to a method for providing a gate metal layer in a transistor device. More specifically, the present disclosure relates to a method for providing a gate metal layer in a transistor device having relatively small gate dimensions, e.g., a relatively small gate width.

DESCRIPTION OF THE RELATED TECHNOLOGY

A process of manufacturing a MOS semiconductor transistor can be based on a so called gate-last approach. In the gate-last approach, also referred to as a replacement-gate (RMG) approach, the metal gate deposition occurs after a number of activation anneal steps (e.g., junction activation and/or source/drain activation) and a silicidation step. In an alternative approach, a gate-first approach, the metal gate is deposited on a high-k gate dielectric prior to the activation anneal steps, such that the metal gate is exposed to high temperatures (e.g., temperatures up to 1100 degrees Celsius or higher), which can be detrimental for the proper operation of the device. In the gate-last approach, the metal of the metal gate is thus not exposed to these high temperatures.

In the gate-last approach, a gate dielectric layer and a dummy gate electrode layer are provided and patterned on a substrate, thereby forming a dummy gate stack. Later, spacers are provided beside the dummy gate stack, and activation of the source/drain areas is performed. An additional silicidation process can be performed, which is known to the skilled person. The patterned dummy gate stack is then completely or partially removed and replaced by a final gate stack.

In a Field Effect Transistor (FET) device, the gate requires a threshold voltage (Vt) to render the channel conductive. Complementary MOS (CMOS) processes fabricate both n-channel and p-channel (respectively NMOS and PMOS) transistors. The threshold voltage (Vt) is influenced by what is called the effective work function difference ($\Delta WF_{eff}$). To establish threshold voltage (Vt) values, the effective work function differences of the respective PMOS and NMOS gate materials (gate stacks) and their corresponding channel regions are typically independently established through channel processing and gate processing. In other words, both a gate dielectric (including, for example, a host dielectric and possible different capping layers) and a gate electrode (including, for example, at least one metal layer) determine the effective work function of the gate stack (device) ($WF_{eff}$). Moreover, the gate processing itself (e.g., the sequence of the different processes and/or the thermal treatments applied) may have an influence on the effective work function of the gate stack (device) ($WF_{eff}$).

In a replacement metal gate FET, TiAl is known to be an appropriate metal for controlling the threshold voltage. The TiAl metal is generally formed by Physical Vapor Deposition (PVD) or Chemical Vapor Deposition (CVD). However, it is difficult to provide a final gate stack for small gate widths (e.g. filling the gap between the spacers generated by the dummy gate structure) to provide good control of the threshold voltage (Vt).

There exists a need for processes that allow for better control of these threshold voltages.

SUMMARY

According to a first aspect of the present disclosure, a method is provided for manufacturing a field effect transistor. The method includes providing a dummy gate structure on a substrate. The dummy gate structure may include a gate dielectric layer and dummy gate electrode layer, and the dummy gate structure may be laterally defined by inner sidewalls of a set of spacers. The method also includes laterally embedding the dummy gate structure by means of one or more embedding layers. The one or more embedding layers may define a front surface. Further, the method includes removing the dummy gate electrode layer in between the inner sidewalls of the set of spacers and providing a final gate electrode layer replacing the dummy gate electrode layer in between the inner sidewalls of the set of spacers. Providing the final gate electrode layer includes providing a connected diffusion layer that may extend at least on top of the gate dielectric layer, on inner sidewalls of the set of spacers, and/or at least on a portion of the front surface. Further, providing the final gate electrode layer may include providing a metal layer comprising a metal on top of the diffusion layer and applying an anneal step that is adapted for driving diffusion of the metal into the diffusion layer, and for further diffusing the metal in the diffusion layer towards the portion of the diffusion layer in the area corresponding to the area of the gate dielectric. In addition, providing the final gate electrode layer may include filling the area in between the inner sidewalls of the set of spacers with a final gate metal filling layer.

The portion of the front surface can correspond to an upper surface of the set of spacers. The upper surface of the set of spacers and the front surface of the one or more embedding layers may lie in a single plane. This single plane may have been defined by a planarization process, as for instance a CMP process, performed on an intermediate structure that includes a dummy gate structure and one or more transistor embedding layers surrounding the dummy gate structure.

The diffusion layer may be connected to the gate dielectric layer and/or the spacers, for example, and also may be continuous. The diffusion layer may also be a conformal layer that follows substantially a surface of an underlying topology, and may have a uniform thickness. Such a conformal layer generally does not substantially change the underlying topology, e.g., the shape of the underlying surface. Being "connected" is a concept that is also known in mathematics. It will be recognized that a layer that is itself connecting any two points within that layer is a connected layer. In a certain view, it is an uninterrupted layer. As the skilled person will recognize, in view of aspects of the present disclosure, the layer may be connected in order to allow diffusion throughout the layer of metal from the front surface towards the portion of the diffusion layer in the area corresponding to the area of the gate dielectric.

According to the embodiments disclosed herein, the diffusion layer may include or consist of silicon, such as polycrystalline silicon, multicrystalline silicon, or monocrystalline silicon. Further, as disclosed herein, the diffusion layer may have a thickness within the range of about 2 to 10 nm. The metal layer may include Aluminum, Indium, Gallium or Nickel. In accordance with disclosed embodiments, the anneal step may be performed at a temperature between about 400° C. and 600° C. In addition, the anneal step may have a duration of between about 1 to 10 minutes.

In accordance with embodiments of the present disclosure, the horizontal distance between the inner sidewalls of the spacers may be smaller than about 20 nm. Further, the vertical distance between the metal layer in an area corresponding to the upper surface of the set of spacers and the upper surface of the diffusion layer in an area on top of the gate dielectric layer m smaller than about 170 nm. This may be advantageous as it reduces the time period for successfully driving diffusion of the metal into the diffusion layer, and for further diffusing the metal in the diffusion layer towards the portion of the diffusion layer in the area corresponding to the area of the gate dielectric.

In other embodiments, the vertical distance between the metal layer in an area corresponding to the upper surface of the set of spacers and the upper surface of the diffusion layer in an area on top of the gate dielectric layer can be larger than about 60 nm. It will be appreciated to the skilled person that methods according to aspects of the present disclosure can be applied for a relatively large vertical distance between the metal layer in an area corresponding to the upper surface of the set of spacers and the upper surface of the diffusion layer in an area on top of the gate dielectric layer.

In yet other embodiments, the diffusion layer can be deposited by means of Chemical Vapor Deposition (CVD). In addition, the anneal step may be such that the diffusion layer and the metal layer merge completely into a single merged layer of mixed constitution, in other words into a single merged layer that is homogeneous, e.g., with a constant constitution.

According to embodiments of the present disclosure, the method further include performing a Chemical Mechanical Polishing (CMP) step after applying the anneal step and filling the area in between the inner sidewalls of the set of spacers with a final gate metal filling layer.

According to further embodiments, the field effect transistor is of the non-planar type including at least one FIN structure protruding from a front surface of the substrate, and wherein a dummy gate structure is provided at least partially on the FIN structure and at least partially adjacent to the FIN structure.

According to another aspect of the present disclosure; a field effect transistor includes a gate structure on a substrate. The gate structure includes a gate dielectric layer interfacing the substrate and a gate electrode layer on top of the gate dielectric layer. The gate structure further may be laterally defined by inner sidewalls of a set of spacers, wherein the gate electrode layer further extends along, reaches along, is present at, and/or covers the inner sidewalls of the set of spacers.

According to disclosed embodiments, the gate electrode layer may have a thickness between about 5 to 20 nm. Further, the gate electrode layer may include SiAl, SiIn, SiGa or SiNi. In addition, the horizontal distance between the inner sidewalls of the spacers may be smaller than about 20 nm.

BRIEF DESCRIPTION OF THE DRAWINGS

The disclosure will be further elucidated by means of the following description and the appended figures.

DETAILED DESCRIPTION

Figure 1:
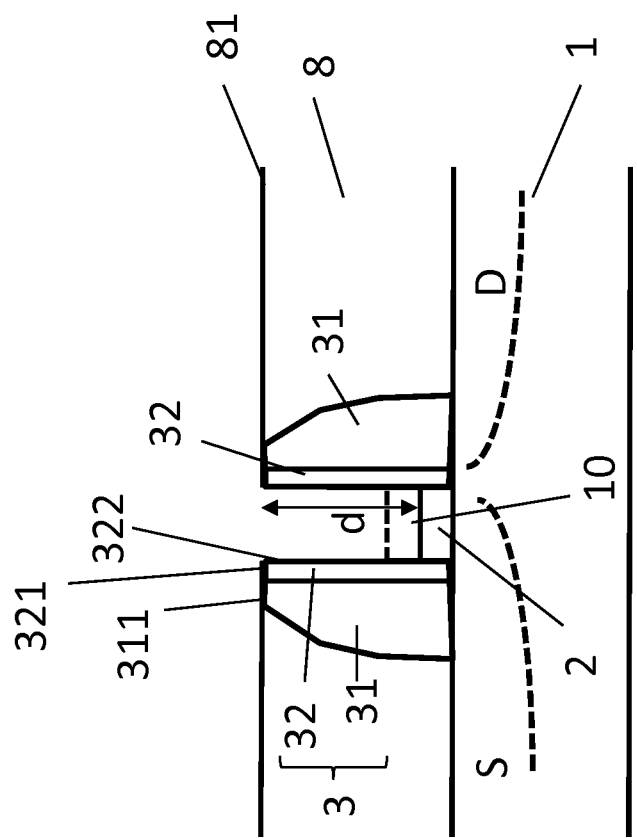
FIGS. 1 to 6 illustrate an embodiment of the present disclosure.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third, and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under, and the like in the description and in the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, which may be referred to as "preferred," are to be construed as example manners in which the disclosure may be implemented rather than as limiting the scope of the disclosure.

The term "comprising", used in the claims, should not be interpreted as being restricted to the elements or steps listed thereafter; it does not exclude other elements or steps. It should be interpreted as specifying the presence of the stated features, integers, steps, or components as referred to, but does not preclude the presence or addition of one or more other features, integers, steps, or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

In the following, certain embodiments of the present disclosure will be described with reference to a silicon (Si) substrate, but it should be understood that these embodiments apply equally well to other semiconductor substrates. In embodiments, the "substrate" may include a semiconductor substrate, such as, e.g., a silicon, a gallium arsenide (GaAs), a gallium arsenide phosphide (GaAsP), an indium phosphide (InP), a germanium (Ge), or a silicon germanium (SiGe) substrate. The "substrate" may also include, for example, an insulating layer such as a $SiO_2$ or a $Si_3N_4$ layer in addition to a semiconductor substrate portion. Thus, the term substrate also includes silicon-on-glass and silicon-on-sapphire substrates. The term "substrate" is thus used to define generally the elements for layers that underlie a layer or portions of interest. Also, the "substrate" may be any other base on which a layer is formed, for example, a glass or metal layer. Accordingly, a substrate may be a wafer such as a blanket wafer or may be a layer applied to another base material, e.g., an epitaxial layer grown onto a lower layer.

FIG. 1 illustrates a semiconductor substrate 1, e.g., a silicon substrate. The substrate may comprise multiple distinct regions. For instance, two distinct regions may be defined in the substrate 1, a first region and a second region. The first region may also be referred to as the first active region of the device (NMOS or PMOS region) and the second region may also be referred as the second active region of the device (PMOS OR NMOS region respectively). The first region and the second region may be electrically isolated from each other by an insulating region. A possible way to isolate the first and second regions from each other is by using shallow trench isolation (STI) in between the regions. STI is typically a deep narrow trench, filled with oxide, etched into the semiconductor substrate in between adjacent devices in an integrated circuit to provide electrical isolation between. Alternatively, local oxidation of silicon (LOCOS) may be used to electrically isolate the regions.

For simplicity reasons only one of those regions is depicted in FIG. 1, and also the insulating region has not been depicted. It will be appreciated that the embodiments of the present invention can be applied for both NMOS as well as PMOS transistors.

After providing the active regions, a gate dielectric layer 2 is provided on the substrate. The dielectric layer 2 may be a layer of insulating material, such as, for example, silicon dioxide ($SiO_2$), silicon nitride (SiN) or silicon oxynitride ($Si_xO_yN_{1-x-y}$), or generally any high-k dielectric material (e.g., k>3.9), such as, for example, $HfO_2$, $TaO_x$, $Al_2O_y$, or any combination made thereof. The gate dielectric layer may be formed by thermal oxidation, atomic layer deposition (ALD) or chemical vapor deposition (CVD) or physical vapor deposition (PVD), or any other suitable method known to a person skilled in the art. The gate dielectric layer may comprise a stack of dielectric materials, such as, for example, a high-k material (e.g., $HfO_2$) formed on top of an (optional) interfacial dielectric layer (e.g., $SiO_2$— not shown) between the substrate 1 and high-k material.

After providing the gate dielectric layer, a dummy gate electrode layer 10 is provided on the gate dielectric layer 2 and spacers are formed.

In a further process, the patterned dummy gate electrode layer is removed, resulting in a device depicted in FIG. 1. The removal of the patterned dummy gate electrode may be done, for example, by means of a wet etch process or other etch processes known by the skilled person.

Conventional process steps, materials, and equipment may be used to generate a device as illustrated in FIG. 1, which is of a planar type. For example, the process steps may include patterning (e.g., using conventional lithography) the gate dielectric layer 2 and the dummy gate electrode layer to form a dummy gate stack, providing one or more spacers 3 (31,32) aside of the dummy gate stack, activation of the source (S) and/or drain (D) regions (extension regions/junction regions) in the first region, and additional silicidation. For the activation of the source/drain regions and as well for the formation of the silicide regions in the source/drain regions an annealing process may be performed. This annealing process may be a high temperature process and also a high thermal budget process. The temperature of the annealing process is typically higher than 500 degrees Celsius, preferably higher than 800 degrees Celsius, more preferably in the range of 800 degrees Celsius to 1200 degrees Celsius. Spike annealing or rapid thermal annealing (RTA) may be used, for example.

The spacers 3 (31,32) may include an insulating material such as, for example, silicon dioxide ($SiO_2$), silicon nitride (SiN), or silicon oxynitride (SiON). The spacers can, for instance, include a stack structure, such as SiN/SiO. Spacers 3 (31,32) may be deposited by ALD or CVD and patterned by anisotropic etching, or any other suitable method known to a person skilled in the art.

After removing the dummy gate electrode material, the underlying gate dielectric layer 2 is exposed. The removal of the dummy gate electrode material may be done using an etching process which is selective towards the underlying gate dielectric material. More specifically, one or more embedding layers 8, for instance a dielectric layer 8, may be formed. The formation of the dielectric layer 8 (e.g., a premetal dielectric layer) may be done, for example, by depositing the dielectric layer 8 using CVD, followed by polishing back to a level corresponding to a front surface 81, 321, 311 (e.g., using CMP) of the dielectric layer 8 (or an embedding layer or stack of embedding layers; or stack of dielectric embedding layers) to expose the dummy gate electrode material in the gate region. The dielectric layer 8 forms a protective layer for protecting the underlying source/drain regions and silicide regions and spacers 3 during the subsequent etching process for removing the dummy gate electrode material. Alternatively, a protective dielectric liner may be formed on the source/drain regions and silicide regions and aside of the spacers 3. Using a CMP-less hard mask opening process, the dummy gate electrode material may be removed. After removing the dummy gate electrode material a trench is formed (having a depth d) in the area in between the sidewall spacers 3, delimited by the upper surface of the gate dielectric 2 and the inner sidewalls of the spacer structure 3 (322). After removal of the dummy gate electrode material, the gate dielectric layer 2 is still present in the gate stack.

Figure 2:
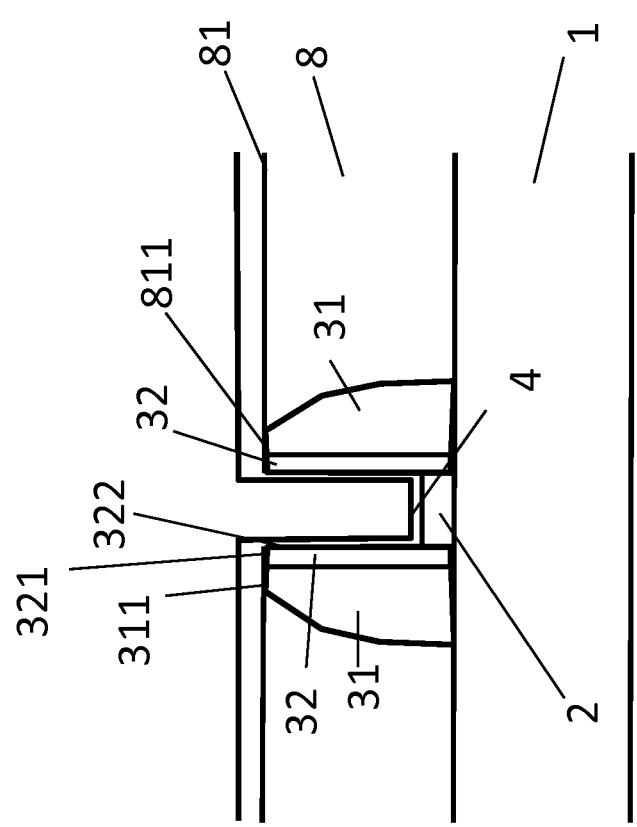

A final gate electrode layer is then applied in between the inner sidewalls of the set of spacers. According to preferred embodiments of the present disclosure, this can be achieved as follows. A connected, conformal diffusion layer 4 is applied, for instance a silicon layer, the diffusion layer extending, at least partially covering, or being present at least on top of the gate dielectric layer, on inner sidewalls of the set of spacers, and on an upper surface 811 of the set of spacers (311 and/or 321) or on a front surface, as for instance depicted in FIG. 2. Note that in the example given the spacer structures 3 each comprise a first spacer 31 and a second spacer 32, which may be optional. The inner sidewall 322 of the spacer 32, but more generally the spacer structure 3, laterally defines the gate trench.

The diffusion layer can, for instance, comprise or consist of silicon, which can be applied by a CVD process, for example. The thickness of the diffusion layer 4 is preferably within the range of 2 to 10 nm, such as 5 nm. This CVD deposited silicon layer can be deposited at a temperature of 600° C., for instance. The diffusion layer may be applicable in a substantially conformal way over the front surface of the substrate and within the gate trench, e.g., on top of the gate dielectric 2 and the inner sidewalls 322 of the spacer structures 3.

Figure 3:
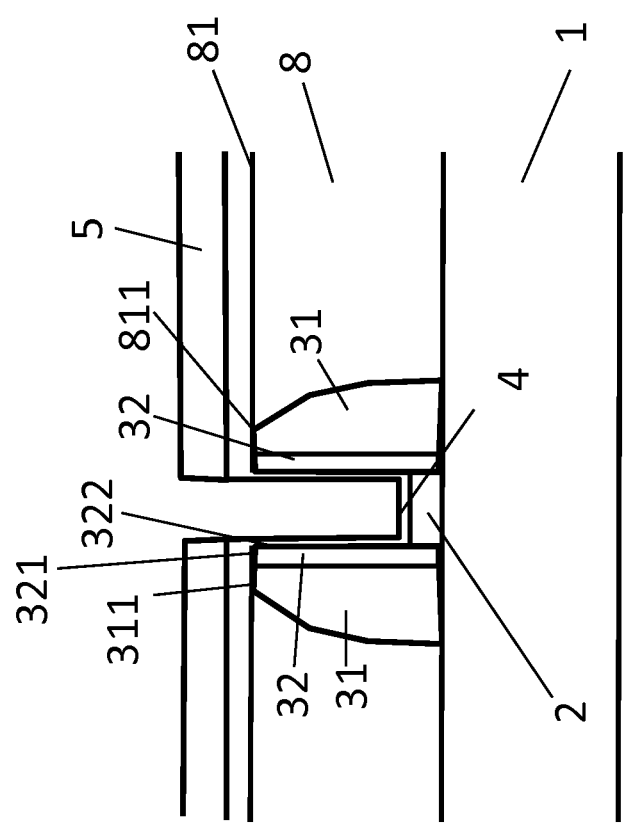

Then, a metal layer 5 is provided comprising a metal on top of the diffusion layer 4, at least in or only in the area corresponding to the upper surface of the set of spacers or front surface, as illustrated in FIG. 3. The metal layer can, for instance, be an Aluminum layer deposited by Plasma Vapor Deposition (PVD) or CVD at room temperature, and can be for instance 20 nm thick. Possibly, under certain circumstances, some metal of the metal layer 5 may thereby enter the gate trench, but this is not necessary, e.g., the metal layer may not have a similar requirement of being conformal. Indeed, it has been shown that the metal of the metal layer 5 on top of (and thus preferably in direct physical contact with) the diffusion layer 4, outside the gate trench, on the front surface 81, and/or on an upper surface of the set of spacers 811, can diffuse into the gate trench along the diffusion layer towards and up to the portion of the diffusion layer in the area corresponding to the area of the gate dielectric.

Figure 4:
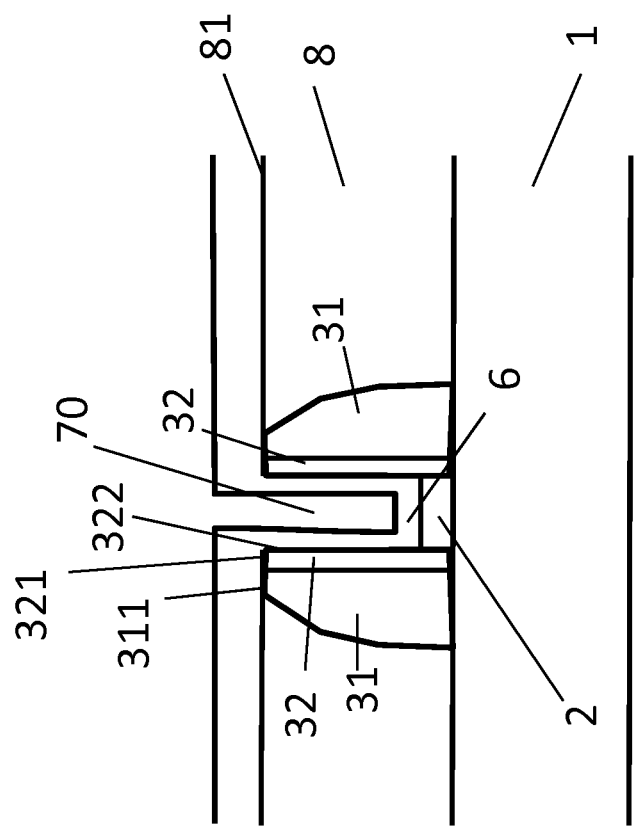

Then, an anneal step is applied, the anneal step being adapted for driving diffusion of the metal into the diffusion layer 4, and for further diffusing the metal in the diffusion layer towards the portion of the diffusion layer in the area corresponding to the area of the gate dielectric. The anneal step can be such that the diffusion layer 4 and the metal layer 5 merge completely into a single merged layer of mixed constitution 6, as illustrated in FIG. 4, for instance an alloy layer, as for instance a Silicon Aluminum alloy. Preferably, the anneal step is applied at a temperature between 450° C. and 550° C., for instance at about 500° C. The anneal step can be performed in the presence of a forming gas, for instance under a N2 atmosphere. The duration of the anneal can be tuned in order to achieve the desired effect, and can depend on for instance the temperature and the distance, which can be approximated by the vertical distance, that the metal has to diffuse in order to reach the gate electrode area. The duration can for instance be between 1 and 60 minutes, for instance 5 minutes. The vertical distance can correspond to a distance along a direction perpendicular on a main surface of the underlying substrate.

The vertical distance between the metal layer in an area corresponding to the upper surface of the set of spacers (311, 321) and/or front surface 81, and the upper surface of the diffusion layer in an area on top of the gate dielectric layer can for instance be in the range of 60 nm to 170 nm, for instance in the range of 60 nm to 120 nm. It can preferably be smaller than 170 nm, for instance when the diffusion anneal step is performed at 500° C.

The diffusion layer is preferably a silicon layer or silicon comprising layer, but other layers which can be applied in a similar way, and which would allow diffusion and/or merging into an alloy which can serve as gate electrode layer by interaction with an associated metal (layer) as explained before can be used, as will be appreciated by the skilled person.

Figure 5:
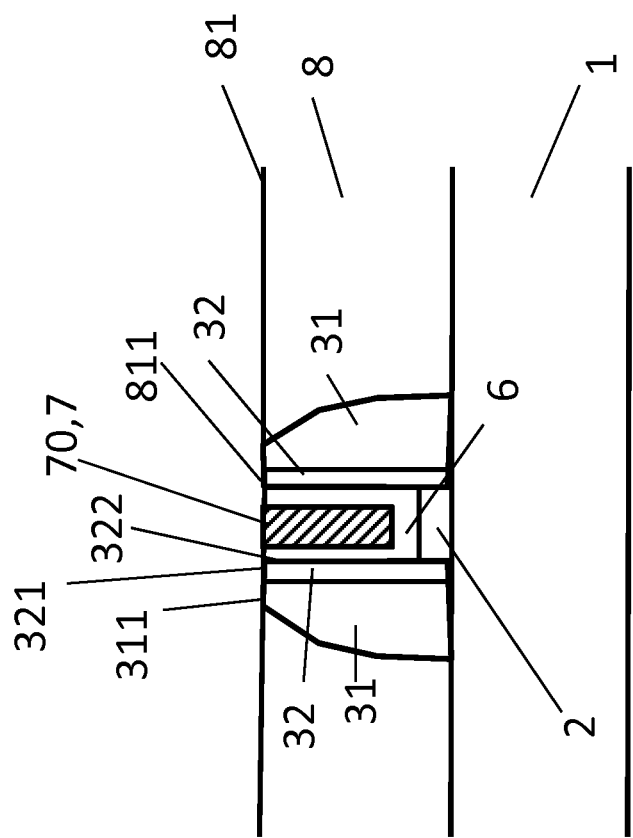

Then, the remaining open area 70 in between the inner sidewalls 322 of the set of spacers 3 is filled with a final gate metal filling layer 7, for instance a W, Al, or Cu layer, according to state of the art techniques known to the skilled person, as illustrated in FIG. 5. For instance, a metal layer can be deposited over the front surface of the substrate, filing the gate trench but possibly covering the area next to the trench also. A CMP step can then be applied to remove the metal layer outside of the gate area, for instance to a level corresponding to the level of the front surface 81 or upper surfaces of the spacers 3 (311, 321), or a lower level parallel to this level. Note that the layer of mixed constitution 6 remains in the final device.

It is an advantage of embodiments of the present disclosure that for small gate dimensions, corresponding to small gate trench dimensions, for instance to a gate length of 20 nm or less, still a good control can be achieved of the threshold voltage of the final transistor device.

Figure 6:
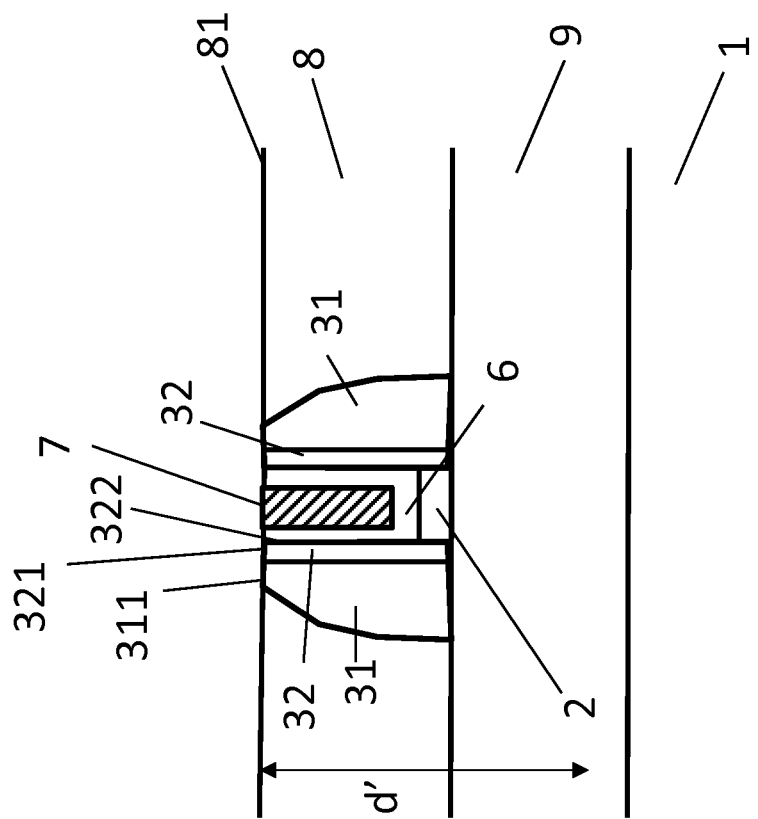

The embodiments described above relate to a transistor device with an active region or layer of the planar type. The upper surface of the active region or layer lies flat with the surrounding front surface of the substrate. FIG. 6 illustrates that embodiments of the present disclosure are also applicable in the context of non-planar devices, as for instance FINFET devices or other devices wherein the active layer or region 9 protrudes from a front surface of the substrate. The active layer can, for instance, be provided as a FIN structure 9 on top of a front surface of a substrate 1. The dummy gate structure or final gate structure can then be provided at least partially on top of the active region, and can be provided around the protruding region (e.g. FIN structure), in a certain view "wrapping" the FIN structure, in first areas. In second areas the same dummy gate structure or final gate structure can be provided on the substrate 1, while extending adjacent to the FIN structure, for instance towards a further adjacent FIN structure on the substrate.

It will be appreciated that in the embodiments with one or more protruding active regions (e.g., FIN structures), it may be more difficult to provide a metal electrode layer in the trench defined by the dummy gate structure, for instance in the area on the substrate adjacent to the FIN structure. This may be because of the increase of height variations on the front surface of the intermediate substrate (represented by the arrow d' in FIG. 6, which ends at its lower end at a level of the upper surface of the dielectric layer (itself not depicted) in the area adjacent to the FIN, for instance in between two adjacent, closely spaced FINs). Embodiments of the present disclosure may then be even more advantageous.

The following combination of process parameters has been proven to be successful:
providing a diffusion layer of polycrystalline silicon, deposited by CVD at 600° C., having a thickness of about 5 nm;
depositing by PVD or CVD of an aluminium layer having a thickness of about 20 nm on the diffusion layer;
performing a thermal anneal in a N2 atmosphere, at 500° C. for about 5 minutes.

It will furthermore be appreciated that for different "technology nodes", known to the skilled person to be the typical dimension of the gate length, corresponding to the horizontal distance in between the inner sidewalls of the set of spacers, different optimal thicknesses of the diffusion layer may exist. For instance, for the 20 nm node and 14 nm node an optimal thickness is a thickness of about 5 nm. For the 10 nm node, this optimal thickness is expected to be smaller, and can be for instance 4 nm. For the 7 nm node, an optimal thickness can be 3 nm. The thickness of the metal layer (also called metal source) can be about 20 nm for all nodes. When generalising, a typical combination of diffusion layer/metal layer, for instance silicon layer/metal layer, has a thickness combination of 5 nm/20 nm.

What is claimed is:

1. A method for manufacturing a field effect transistor, the method comprising the steps of:
providing a dummy gate structure on a substrate, the dummy gate structure comprising a gate dielectric layer, the dummy gate structure being laterally defined by a gate trench defined by inner sidewalls of a set of spacers;
laterally embedding the dummy gate structure by one or more embedding layers, the one or more embedding layers defining a front surface;
and
providing a final gate electrode layer in between the inner sidewalls of the set of spacers;
and wherein providing the final gate electrode layer further comprises:
providing a diffusion layer, the diffusion layer extending at least on top of the gate dielectric layer, on inner sidewalls of the set of spacers, and on at least a portion of the front surface;
providing a metal layer including a metal on top of a portion of the diffusion layer that is disposed over the front surface, and whereby the metal does not enter the gate trench;
applying an anneal step, the anneal step being adapted for driving diffusion of the metal of the metal layer into the diffusion layer, and for further diffusing the metal in the diffusion layer towards the portion of the diffusion layer in the area corresponding to the area of the gate dielectric; and
filling the area in between the inner sidewalls of the set of spacers with a final gate metal filling layer.

2. The method according to claim 1, wherein the diffusion layer comprises silicon.

3. The method according to claim 1, wherein the diffusion layer has a thickness within the range of 2 to 10 nm.

4. The method according to claim 1, wherein the metal layer comprises Aluminium, Indium, Gallium, or Nickel.

5. The method according to claim 1, wherein the anneal step is performed at a temperature between 400° C. and 600° C.

6. The method according to claim 1, wherein the anneal step has a duration of 1 to 10 minutes.

7. The method according to claim 1, wherein a horizontal distance between the inner sidewalls of the spacers is smaller than 20 nm.

8. The method according to claim 1, wherein the diffusion layer is deposited by means of Chemical Vapor Deposition (CVD).

9. The method according to claim 1, wherein the anneal step is such that the diffusion layer and the metal layer merge completely into a single merged layer of mixed constitution.

10. The method according to claim 1, further comprising performing a Chemical Mechanical Polishing (CMP) step after applying the anneal step and filling the area in between the inner sidewalls of the set of spacers with a final gate metal filling layer.

11. The method according to claim 1, wherein a vertical distance between the metal layer on the front surface, and an upper surface of the diffusion layer in an area on top of the gate dielectric layer is smaller than 170 nm.

12. The method according to claim 1, wherein the dummy gate structure further includes a dummy gate electrode layer, wherein the method further comprises removing the dummy gate electrode layer in between the inner sidewalls of the set of spacers, and wherein the final gate electrode layer replaces the dummy gate electrode layer.

13. The method according to claim 1, wherein the field effect transistor is a non-planar type that includes at least one FIN structure protruding from a front surface of the substrate, and wherein the dummy gate structure is provided at least partially on the FIN structure and at least partially adjacent to the FIN structure.

* * * * *